(12) United States Patent
Shim

(10) Patent No.: US 9,396,799 B2
(45) Date of Patent: Jul. 19, 2016

(54) SEMICONDUCTOR MEMORY DEVICE IMPROVING THRESHOLD VOLTAGE OF UNSELECTED MEMORY BLOCK AND METHOD OF OPERATING THE SAME

(71) Applicant: SK hynix Inc., Icheon-si Gyeonggi-do (KR)

(72) Inventor: Keon Soo Shim, Icheon-si Gyeonggi-do (KR)

(73) Assignee: Sk hynix Inc., Icheon-si Gyeonggi-do (KR)

( * ) Notice: Subject to any disclaimer, the term of this patent is extended or adjusted under 35 U.S.C. 154(b) by 0 days.

(21) Appl. No.: 14/692,323

(22) Filed: Apr. 21, 2015

(65) Prior Publication Data

US 2016/0141035 A1    May 19, 2016

(30) Foreign Application Priority Data

Nov. 19, 2014  (KR) .......................... 10-2014-0161663

(51) Int. Cl.
*G11C 16/04* (2006.01)
*G11C 16/10* (2006.01)

(52) U.S. Cl.
CPC ............ *G11C 16/10* (2013.01); *G11C 16/0408* (2013.01); *G11C 16/0483* (2013.01)

(58) Field of Classification Search
CPC ........ G11C 16/08; G11C 16/12; G11C 16/16; G11C 16/3445; G11C 16/3459; G11C 16/0483
USPC ............. 365/185.11, 185.17, 185.05, 185.25, 365/185.26
See application file for complete search history.

(56) References Cited

U.S. PATENT DOCUMENTS

| 8,295,087 | B2 * | 10/2012 | Lee | ......................... | G11C 16/08 |
| | | | | | 365/184 |
| 8,988,937 | B2 * | 3/2015 | Dunga | .................... | G11C 16/12 |
| | | | | | 365/185.02 |
| 2014/0112075 | A1 | 4/2014 | Dunga et al. | | |
| 2015/0078086 | A1 * | 3/2015 | Lee | ..................... | G11C 16/0483 |
| | | | | | 365/185.11 |

FOREIGN PATENT DOCUMENTS

KR      1020140020135 A      2/2014

* cited by examiner

*Primary Examiner* — Gene Auduong
(74) *Attorney, Agent, or Firm* — William Park & Associates Ltd.

(57) ABSTRACT

A semiconductor memory device and a method of operating the same are provided. The device may include a memory cell array including a plurality of memory blocks and a peripheral circuit configured for selecting one of the plurality of memory blocks and performing a program operation on selected memory cells of the selected memory block when the program operation is performed. The peripheral circuit may be configured to float a plurality of source select lines and a plurality of drain select lines of an unselected memory block of the plurality of memory blocks when the program operation is performed.

19 Claims, 6 Drawing Sheets

SEMICONDUCTOR MEMORY DEVICE IMPROVING THRESHOLD VOLTAGE OF UNSELECTED MEMORY BLOCK AND METHOD OF OPERATING THE SAME

CROSS-REFERENCE TO RELATED APPLICATION

The present application claims priority to Korean patent application number 10-2014-0161663 filed on Nov. 19, 2014, in the Korean Intellectual Property Office, the entire disclosure of which is incorporated by reference herein.

BACKGROUND

1. Technical Field

Various embodiments generally relate to an electronic device, and more particularly, to a semiconductor memory device and a method of operating the same.

2. Related Art

Semiconductor memory devices are classified into volatile memory devices and nonvolatile memory devices.

While the volatile memory devices have relatively fast read and write speeds, stored data is lost when their power supplies are interrupted. While the nonvolatile memory devices have relatively slow read and write speeds, stored data is retained even when their power supplies are interrupted. Therefore, the nonvolatile memory devices are used to retain stored data regardless of whether their power supplied has been interrupted or not. The nonvolatile memory devices may include a read only memory (ROM), a mask ROM (MROM), a programmable ROM (PROM), an erasable programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), etc. The flash memories may be classified as either a NOR type or a NAND type of flash memory.

Flash memories may include RAM and ROM. RAM provides advantages through programming and erasing data relatively easily. ROM provides an advantage by allowing stored data to be retained even though the power supply of the flash memory may be interrupted. The flash memory has been widely used as a storage medium for a portable electronic device such as a digital camera, a personal digital assistant (PDA), and an MP3 player, etc.

Recently, semiconductor memory devices having a 3-dimensional array structure have been studied to try and improve the degree of integration of the semiconductor memory devices.

The semiconductor memory device is configured to include a plurality of memory blocks including a plurality of memory cells. In the semiconductor memory device, the plurality of memory blocks are sequentially programmed when a program operation is performed. When the program operation on the plurality of memory blocks is completed, a threshold voltage of memory cells included in a first programmed memory block may be read as higher than a threshold voltage when the program operation on the corresponding memory block is completed. In cell strings included in an unselected memory block, due to a bias condition applied to an unselected memory block, an electron-hole pair (EHP) by gate-induced-drain-leakage (GIDL) current phenomenon may be generated between a bit line and a drain select transistor and between a source line and a source select line when the program operation on a subsequently selected memory block is performed. Electrons generated at this time may be discharged through the bit line or the source line. However, holes may be trapped in a channel of the cell string and thus channel potential is increased.

SUMMARY

In an embodiment, a semiconductor memory device may include a memory cell array including a plurality of memory blocks. The semiconductor memory device may include a peripheral circuit configured for selecting one of the plurality of memory blocks and performing a program operation on selected memory cells of the selected memory block when the program operation is performed. The peripheral circuit may be configured to float a plurality of source select lines and a plurality of drain select lines of an unselected memory block of the plurality of memory blocks when the program operation is performed.

In an embodiment, a semiconductor memory device may include a memory cell array including a plurality of memory blocks, and a peripheral circuit configured to sequentially perform a program operation on the plurality of memory blocks. The semiconductor memory device may include a control circuit configured to control the peripheral circuit to perform the program operation, and the control circuit may control the peripheral circuit to float a plurality of source select transistors and a plurality of drain select transistors included in an unselected memory block of the plurality of memory blocks.

In an embodiment, a method of operating a semiconductor memory device may include selecting a memory block of a plurality of memory blocks in order to perform a program operation, and performing the program operation on the selected memory block. The method of operating the semiconductor memory device may include floating gates of a plurality of source select transistors and gates of a plurality of drain select transistors included in all of the memory blocks except the selected memory block.

DETAILED DESCRIPTION

Various embodiments will now be described below with reference to the accompanying drawings in which various embodiments are illustrated. These embodiments, however, be embodied in different forms and should not be construed as limited to the embodiments set forth herein. Rather, these embodiments are provided so that this disclosure is thorough and complete and may fully convey the embodiments to those skilled in the art.

Throughout this specification, when an element is referred to as being "connected" to another element, it includes that the element can be "directly connected" to the other element or "indirectly connected" to the other element with other intervening element(s). Throughout this specification, when a certain part "includes" a certain component, it means that another component may be further included instead of excluding any other components unless otherwise defined.

Due to the above mentioned issues (i.e., increased channel potentials etc), a threshold voltage, when a read operation of the programmed memory block is performed, may be read as higher rather than immediately after the program operation is completed.

Thus, various embodiments may be directed to a semiconductor memory device, in which data is accurately read when a read operation is performed after a program operation by an improvement in which a threshold voltage of an unselected memory block is increased when the program operation of the semiconductor memory device is performed, and a method of operating the same.

Figure 1:
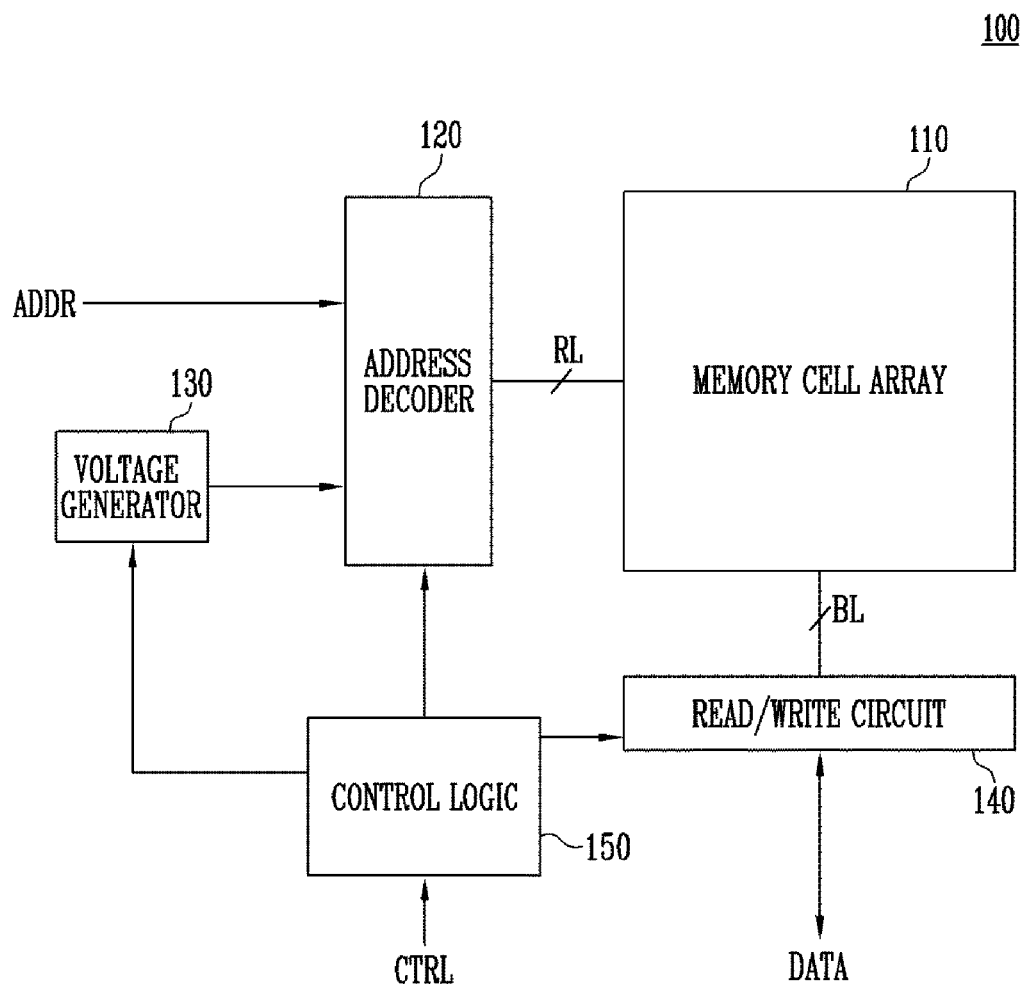
FIG. 1 is a block diagram illustrating a representation of an example of a semiconductor memory device according to an embodiment.

FIG. 1 is a block diagram illustrating a representation of an example of a semiconductor memory device 100 according to an embodiment.

Referring to FIG. 1, the semiconductor memory device 100 may include a memory cell array 110, an address decoder 120, and a voltage generator 130. The semiconductor memory device 100 may include a read/write circuit 140, and a control logic 150.

The memory cell array 110 may be connected to the address decoder 120 through row lines RL. The memory cell array 110 may be connected to the read/write circuit 140 through bit lines BL.

The memory cell array 110 may include a plurality of memory blocks. Each of the plurality of memory blocks may include a plurality of cell strings. Each of the plurality of cell strings may include a plurality of memory cells stacked on a substrate. In an embodiment, the plurality of memory cells may be nonvolatile memory cells. In an embodiment, each of the plurality of memory cells may be defined as a single-level cell or a multi-level cell. The memory cell array 110 will be described with reference to FIGS. 2 and 3 below.

The address decoder 120, the voltage generator 130, and the read/write circuit 140 may operate as peripheral circuits for driving the memory cell array 110.

The address decoder 120 may be connected to the memory cell array 110 through the row lines RL. The row lines RL may include drain select lines, word lines, source select lines, and a common source line. In an embodiment, the row lines RL may further include a pipe select line.

The address decoder 120 may be configured to drive the row lines RL in response to control of the control logic 150. The address decoder 120 may receive an address ADDR from the outside or an input/output buffer (not illustrated) in the semiconductor memory device 100.

A program operation of the semiconductor memory device 100 may be performed in a memory block unit. The program operation may be performed on a selected memory block of the plurality of memory blocks, and an unselected memory block may operate in a program inhibition mode. In an example, the selected memory block may be set to at least one or more memory blocks.

While the program operation is performed, a program voltage and a pass voltage for the program operation may be applied to the word lines connected to the selected memory block and operating voltages for turning on source select transistors and drain select transistors may be applied to the source select lines and the drain select lines connected to the selected memory block. While the program operation is performed, the word lines connected to the unselected memory block may be controlled to be in a floating state, some of the source select lines and some of the drain select lines, connected to the unselected memory block, are controlled to be in the floating state, and a ground voltage may be applied to the other source select lines and the other drain select lines.

The address decoder 120 may include a block decoder, a row decoder, an address buffer, etc.

The voltage generator 130 may be configured to generate a plurality of voltages using an external voltage supplied to the semiconductor memory device 100. The voltage generator 130 may operate in response to control of the control logic 150.

In an embodiment, the voltage generator 130 may include a circuit configured for generating a power voltage by adjusting the external voltage. In an embodiment, the voltage generator 130 may include a plurality of pumping capacitors and may generate the plurality of voltages by selectively activating the plurality of pumping capacitors.

The read/write circuit 140 may be connected to the memory cell array 110 through the bit lines BL. The read/write circuit 140 operates in response to control of the control logic 150.

When the program operation is performed, the read/write circuit 140 may apply a program allowable voltage to a selected bit line of the bit lines BL and a program inhibition voltage to an unselected bit line. When the program operation or a read operation is performed, the read/write circuit 140 may exchange data DATA with the outside or the input/output buffer (not illustrated) of the semiconductor memory device 100.

In an embodiment, the read/write circuit 140 may include page buffers (or page resistors), a column select circuit, etc.

The control logic 150 may be connected to the address decoder 120, the voltage generator 130, and the read/write circuit 140. The control logic 150 may receive a control signal CTRL from the outside or the input/output buffer (not illustrated) of the semiconductor memory device 100. The control logic 150 may be configured to control the overall operations of the semiconductor memory device 100 in response to the control signal CTRL.

The semiconductor memory device 100 may further include the input/output buffer (not illustrated). The input/output buffer may receive the control signal CTRL and the address ADDR from the outside, and may transfer the received control signal CTRL and address ADDR to the control logic 150 and the address decoder 120, respectively. The input/output buffer may be configured to transfer the data DATA received from the outside to the read/write circuit 140 and the data DATA received from the read/write circuit 140 to the outside.

In an embodiment, the semiconductor memory device 100 may be realized as a flash memory device.

Figure 2:
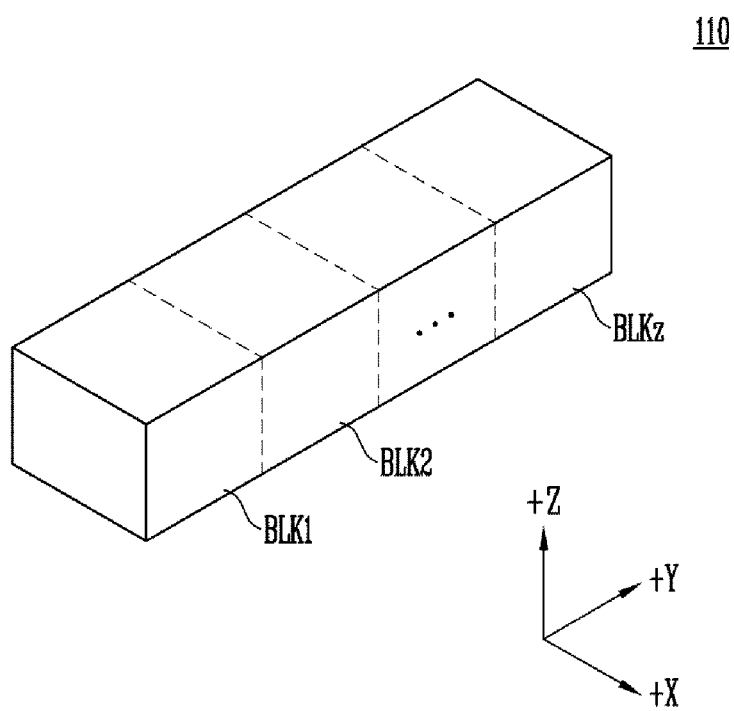
FIG. 2 is a block diagram illustrating a representation of an example of a memory cell array illustrated in FIG. 1.

FIG. 2 is a block diagram illustrating a representation of an example of the memory cell array 110 illustrated in FIG. 1.

Referring to FIG. 2, the memory cell array 110 may include a plurality of memory blocks BLK1 to BLKz. Each memory block may have a 3-dimensional structure. Each memory block may include a plurality of memory cells stacked on a substrate. The plurality of memory cells may be arranged along a +X direction, a +Y direction, and a +Z direction. A structure of each memory block will be described with reference to FIG. 3 below.

Figure 3:
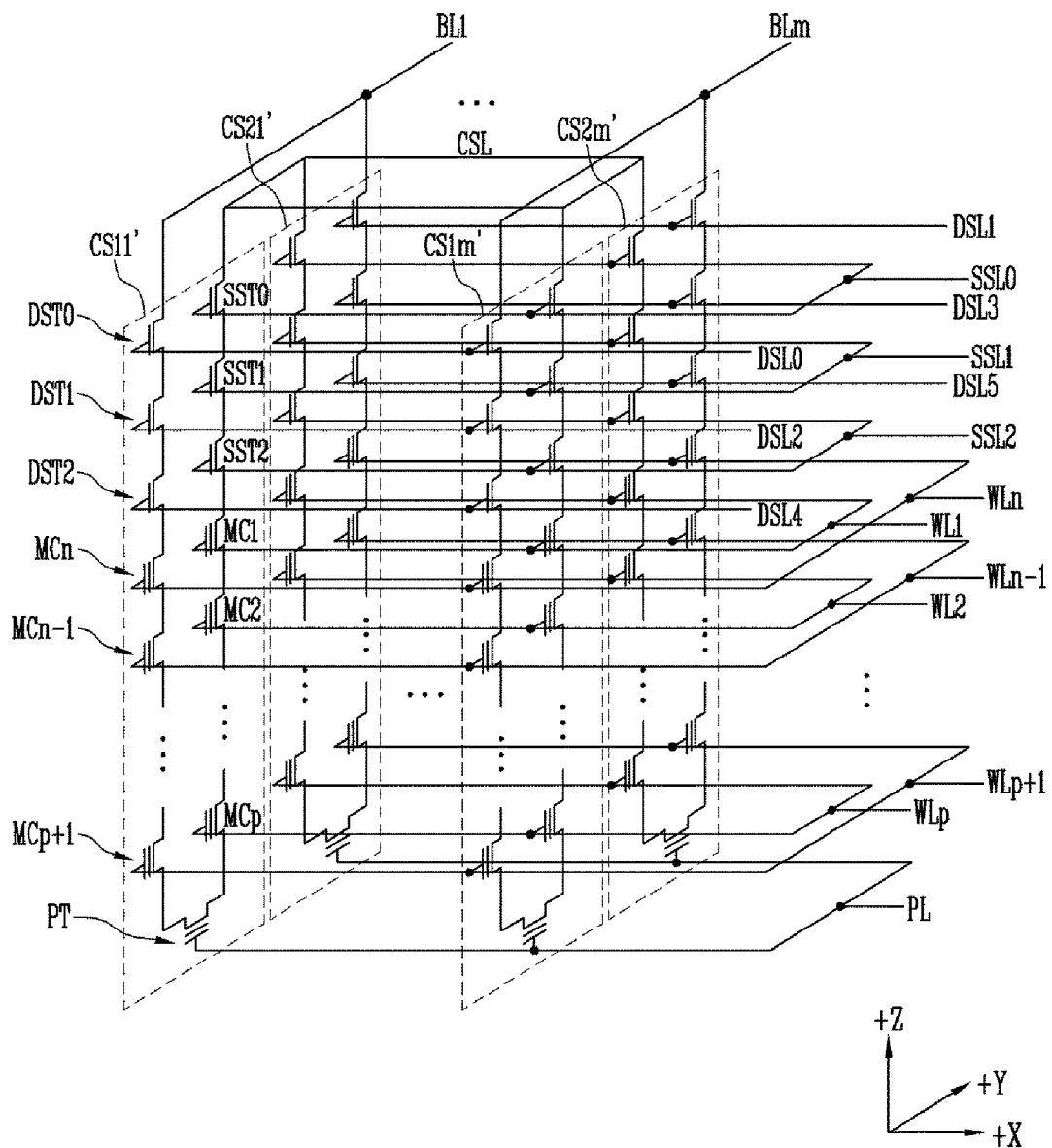
FIG. 3 is a circuit diagram illustrating a representation of an example of any one of the memory blocks illustrated in FIG. 2.

FIG. 3 is a circuit diagram illustrating a representation of an example of any one BLK1' of the memory blocks BLK1 to BLKz illustrated in FIG. 2.

Referring to FIG. 3, a first memory block BLK1' may include a plurality of cell strings CS11' to CS1m' and CS21' to CS2m'. Each of the plurality of cell strings CS11' to CS1m' and CS21' to CS2m' extends along the +Z direction. Each of the plurality of cell strings CS11' to CS1m' and CS21' to CS2m' may include a plurality of source select transistors SST0 to SST2, first to $n^{th}$ memory cells MC1 to MCn, and a plurality of drain select transistors DST0 to DST2. The plurality of source select transistors SST0 to SST2, first to $n^{th}$ memory cells MC1 to MCn, and the plurality of drain select transistors DST0 to DST2 may be stacked along the +Z direction.

A source select transistor SST0, selected from the plurality of source select transistors SST0 to SST2 of each cell string and disposed at an outermost position, may be connected to a common source line CSL. The other source select transistors SST1 and SST2 may be connected between the source select transistor SST0 and a first memory cell MC1. The plurality of source select transistors SST0 to SST2 may be connected to a plurality of source select lines SSL0 to SSL2, respectively.

A gate of the first memory cell MC1 of each cell string may be connected to a first word line WL1. A gate of a second memory cell MC2 of each cell string may be connected to a second word line WL2. A gate of a memory cell MCn−1 of each cell string may be connected to a word line WLn−1. A gate of a memory cell MCp+1 of each cell string may be connected to a word line WLp+1. A gate of a memory cell MCp of each cell string may be connected to a word line WLp. A gate of an $n^{th}$ memory cell MCn of each cell string may be connected to an $n^{th}$ word line WLn. ///Further, a pipe transistor PT may be disposed between a $p^{th}$ memory cell MCp and a $(p+1)^{th}$ memory cell MCp+1, and a gate of the pipe transistor PT may be connected to a pipe line PL.

A drain select transistor DST0, selected from the plurality of drain select transistors DST0 to DST2 of each cell string and disposed at an outermost position, may be connected to a bit line (e.g., BL1). The other drain select transistors DST1 and DST2 may be connected between the drain select transistor DST0 and the $n^{th}$ memory cell MCn. The plurality of drain select transistors DST0 to DST2 may be connected to a plurality of drain select lines DSL0, DSL2, and DSL4, respectively. Drain select lines DSL1, DSL3, and DSL5 are also illustrated in FIG. 3.

In an embodiment as described above, although a structure in which the three source select transistors SST0 to SST2 and the three drain select transistors DST0 to DST2 are disposed has been described, at least two or more source select transistors and drain select transistors may be disposed therein. In an embodiment, the structure is preferably configured to include one outermost source select transistor adjacent to the common source line and at least one or more other source select transistors, and one outermost drain select transistor adjacent to the bit line and at least one or more other drain select transistors.

The drain select transistors DST0 of the cell strings arranged in the same column, that is, in the +Y direction, are connected to the same bit line. The drain select transistors DST0 included in the cell strings CS11' and CS21' may be connected to the first bit line BL1. The drain select transistors DST0 included in the cell strings CS1m' and CS2m' may be connected to an $m^{th}$ bit line BLm.

In an embodiment, although not illustrated in FIG. 3, at least one dummy memory cell may be further provided between the drain select transistor DST2 and the first to $n^{th}$ memory cells MC1 to MCn. In an embodiment, although not illustrated in FIG. 3, at least one dummy memory cell may be further provided between the source select transistor SST2 and the first to $n^{th}$ memory cells MC1 to MCn. The dummy memory cell may be disposed between the memory cells or adjacent to the memory cells for various purposes.

Figure 4:
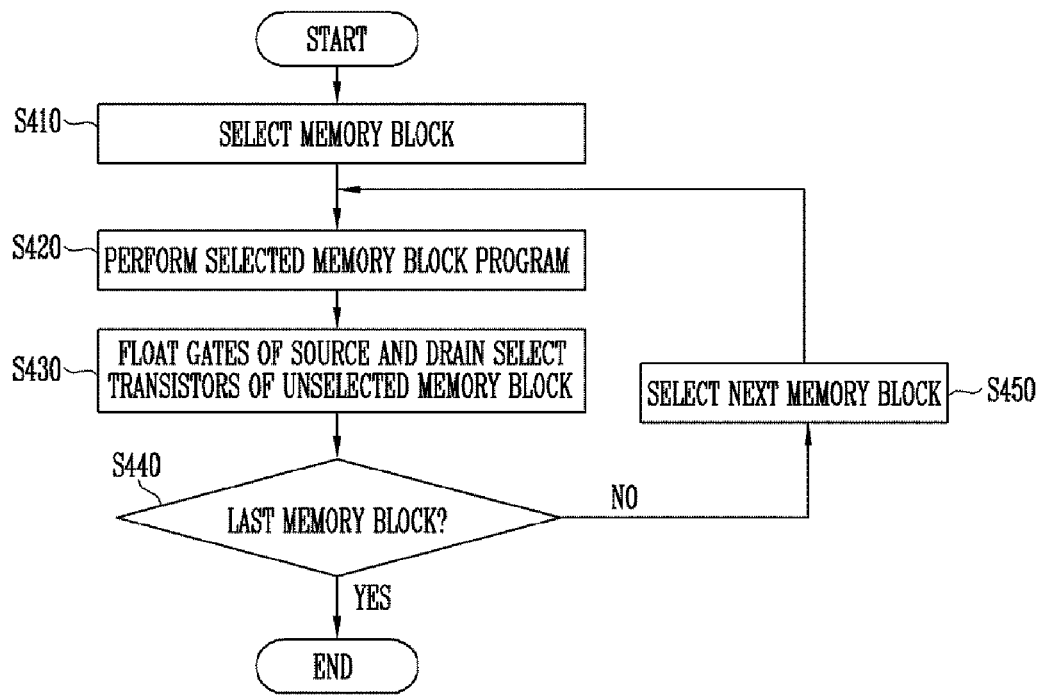
FIG. 4 is a flowchart illustrating an example of a method of operating the semiconductor memory device according to an embodiment.

FIG. 4 is a flowchart illustrating an example of a method of operating the semiconductor memory device according to an embodiment.

The operating of the semiconductor memory device according to an embodiment will be described as follows with reference to FIGS. 1 to 4.

1) Select Memory Block (S410)

First, when a control signal CTRL according to a program command is received from the outside, the control logic 150 selects at least one memory block (e.g., BLK1) from the plurality of memory blocks BLK1 to BLKz included in the memory cell array 110. In this example, the control logic 150 may select one memory block or at least two or more memory blocks.

2) Perform Selected Memory Block Program (S420)

The control logic 150 controls the peripheral circuits so that a program operation on the selected memory block (e.g, BLK1) of the plurality of memory blocks BLK1 to BLKz may be performed. For example, when a program voltage apply operation is performed during the program operation, the voltage generator 130 may generate a program voltage and a pass voltage according to control of the control logic 150. When the program voltage apply operation is performed, the address decoder 120 decodes a row address of the received address ADDR, and applies the program voltage and the pass voltage, generated by the voltage generator 130, to the plurality of word lines WL1 to WLn of the selected memory block BLK1 according to the decoded row address.

After the program voltage apply operation is completed, the control logic 150 controls the peripheral circuits so that a program verify operation may be performed. The program verify operation may verify a program state of the selected memory cells using a plurality of buffers of the read/write circuit 140 after a verify voltage is applied to the word lines of the selected memory cells. When the program verify operation of the selected memory cells is completed and it is determined to pass, a program operation on a next page may be performed.

The control logic 150 may program the pipe transistor PT included in the cell strings of the selected memory block BLK1 and then increase a threshold voltage of the pipe transistor PT while the program operation is performed. This will be described below.

3) Float Gates of Source and Drain Select Transistors of Unselected Memory Block (S430)

The above-described program operation is performed on the selected memory block (S420) and, at the same time, a predetermined voltage may be applied to the source and drain select lines SSL0 to SSL2 and DSL0 to DSL5 of the unselected memory block or unselected memory blocks (e.g., BLK2 to BLKz).

For example, the source select line SSL0 and the drain select lines DSL0 and DSL1 may be controlled so that gates of the source select transistor SST0 adjacent to the common source line CSL and the drain select transistor DST0 adjacent to the bit lines BL1 to BLm are in a floating state, and a ground voltage may be applied to gates of the other source select transistors SST1 and SST2 and the other drain select transistors DST1 and DST2. In this example, two source select transistors adjacent to the common source line CSL may be selected and then the source select lines SSL0 and SSL1 may be controlled so that the gates of the source select transistors SST0 and SST1 are in the floating state, and two drain select transistors adjacent to the bit lines BL1 to BLm may be selected and then the drain select lines DSL0 to DSL3 may be controlled so that the gates of the drain select transistors DST0 and DST1 are in the floating state.

The source select line connected to some source select transistors, selected from the plurality of source select transistors and adjacent to the common source line CSL, and the gates of some drain select transistors, selected from the plurality of drain select transistors and adjacent to the bit lines BL1 to BLm, may be floated, and the ground voltage may be applied to the source select lines and the drain select lines, connected to the other source select transistors and the other drain select transistors, respectively.

In this example, the plurality of word lines WL1 to WLn and the pipe line PL are floated. For this reason, a phenomenon in which gate-induced-drain-leakage (GIDL) current is generated may be suppressed by the source select transistor and the drain select transistor in the floating state even though a power voltage is applied to the bit lines BL1 to BLm and the common source line CSL, which are connected to the unselected memory block. Therefore, the channel potential of the plurality of cell strings CS11' to CS1$m$' and CS21' to CS2$m$' included in the unselected memory block is prevented from increasing.

When the above-described program operation is performed, in the example in which the pipe transistor PT is programmed and the threshold voltage of the pipe transistor PT is increased, leakage current through the source line may be blocked and thus a leakage current blocking effect may be improved when the pipe transistor PT is turned off.

4) Last Memory Block? (S440)

When the program operation of the selected memory block is completed, it may be determined whether an address of the current selected memory block is an address of the last memory block or not. The program operation may end after determining that the current selected memory block is the last memory block.

5) Select Next Memory Block (S450)

In the above-described determination of the address of the selected memory block (S440), in the example in which it is determined that the current selected memory block is not the last memory block, the next memory block is selected and the above-described operations starting from the program operation on the selected memory block (S420) are performed again.

According to an embodiment as described above, in the program operation of the semiconductor memory device including the plurality of memory blocks, the program operation is performed on the selected memory block and, at the same time, some of the source and drain select transistors included in the unselected memory block are floated and thus the channel potential of the cell string may be prevented from increasing. Therefore, data may be accurately read when a subsequent read operation is performed.

Figure 5:
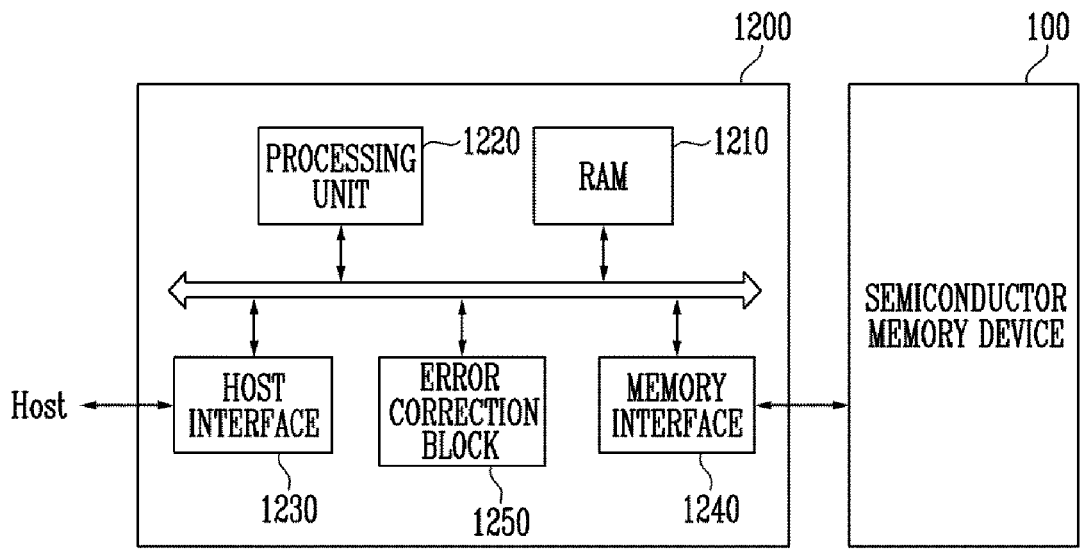
FIG. 5 is a block diagram illustrating a representation of an example of a memory system including the semiconductor memory device illustrated in FIG. 1.

FIG. 5 is a block diagram illustrating a representation of an example of a memory system including the semiconductor memory device illustrated in FIG. 1.

Referring to FIG. 5, the memory system 1000 may include the semiconductor memory device 100 and a controller 1200.

The semiconductor memory device 100 is configured and operates in the same manner as described with reference to FIGS. 1-4. Hereinafter, the description thereof will not be repeated.

The controller 1200 may be connected to a host Host and the semiconductor memory device 100. The controller 1200 may be configured to access the semiconductor memory device 100 in response to a request from the host Host. For example, the controller 1200 may be configured to control read, write, erase, and background operations of the semiconductor memory device 100. The controller 1200 may be configured to provide an interface between the semiconductor memory device 100 and the host Host. The controller 1200 may be configured to drive firmware in order to control the semiconductor memory device 100.

The controller 1200 may include a random access memory (RAM) 1210, a processing unit 1220, a host interface 1230, a memory interface 1240, and an error correction block 1250. The RAM 1210 is used as at least one of an operational memory of the processing unit 1220, a cache memory between the semiconductor memory device 100 and the host Host, and a buffer memory between the semiconductor memory device 100 and the host Host. The processing unit 1220 may control an overall operation of the controller 1200. Further, the controller 1200 may temporarily store program data provided from the host Host when a write operation is performed.

The host interface 1230 may include a protocol to exchange data between the host Host and the controller 1200. In an embodiment, the controller 1200 may be configured to communicate with the host Host through at least one of various interface protocols such as a Universal Serial Bus (USB) protocol, a MultiMediaCard (MMC) protocol, a peripheral component interconnect (PCI) protocol, a PCI-Express (PCI-E) protocol, an advanced technology attachment (ATA) protocol, a serial-ATA protocol, a parallel-ATA protocol, a small computer system interface (SCSI) protocol, an enhanced small disk interface (ESDI) protocol, an integrated drive electronics (IDE) protocol, a private protocol, etc.

The memory interface 1240 may interface with the semiconductor memory device 100. For example, the memory interface 1240 may include a NAND interface or a NOR interface.

The error correction block 1250 may be configured to detect and correct an error of data received from the semiconductor memory device 100 using an error correcting code (ECC). The processing unit 1220 may adjust a read voltage according to an error detection result of the error correction block 1250 and controls the semiconductor memory device 100 so that a re-read is performed. In an embodiment, the error correction block 1250 may be provided as a component of the controller 1200.

The controller 1200 and the semiconductor memory device 100 may be integrated into one semiconductor device. In an embodiment, the controller 1200 and the semiconductor memory device 100 may be integrated into one semiconductor device and configure a memory card. For example, the controller 1200 and the semiconductor memory device 100 may be integrated into one semiconductor device and may configure a memory card such as a personal computer (PC) card (personal computer memory card international association (PCMCIA)), a compact flash (CF) card, a smartmedia (SM) card (SMC), a memory stick, an MMC (reduced size MMC (RS-MMC), MMCmicro), a secure digital (SD) card (miniSD, microSD, SD high capacity (SDHC)), a universal flash storage (UFS), etc.

The controller 1200 and the semiconductor memory device 100 may be integrated into one semiconductor device and configure a solid state drive (SSD). The SSD may include a storage device configured to store data in a semiconductor memory. When the memory system 1000 is used as the SSD, an operation speed of the host Host connected to the memory system 1000 is significantly enhanced.

In an embodiment, the memory system 1000 may be provided as at least one of various components of an electronic device such as a computer, an ultra mobile PC (UMPC), a workstation, a netbook, a personal digital assistant (PDA), a portable computer, a web tablet, a wireless phone, a mobile phone, a smartphone, an e-book, a portable multimedia player (PMP), a portable game console, a navigation device, a black box, a digital camera, a 3-dimensional television, a digital audio recorder, a digital audio player, a digital picture recorder, a digital picture player, a digital video recorder, a digital video player, a device for wirelessly transmitting and receiving information, at least one of various electronic devices configuring a home network, at least one of various electronic devices configuring a computer network, at least one of various electronic devices configuring a telematics network, an RFID device, at least one of various components configuring a computing system, etc.

In an embodiment, the semiconductor memory device 100 or the memory system 1000 may be mounted using various forms of packages. For example, the semiconductor memory device 100 or the memory system 1000 may be packaged in such a manner such as a package on package (PoP), ball grid arrays (BGAs), chip scale packages (CSPs), a plastic leaded chip carrier (PLCC), a plastic dual inline package (PDIP), a die in waffle pack, a die in wafer form, a chip on board (COB), a ceramic dual inline package (CERDIP), a plastic metric quad flat pack (MQFP), a thin quad flatpack (TQFP), a small outline integrated circuit (SOIC), a shrink small outline package (SSOP), a thin small outline (TSOP), a thin quad flatpack (TQFP), a system in package (SIP), a multichip package (MCP), a wafer-level fabricated package (WFP), a wafer-level processed stack package (WSP), and so on, and may be mounted.

Figure 6:
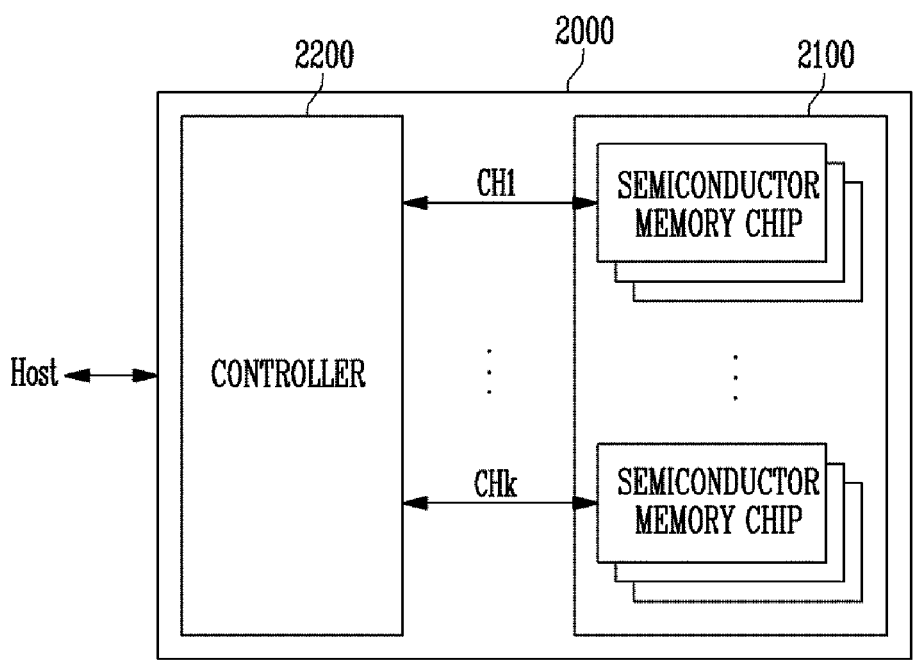
FIG. 6 is a block diagram illustrating a representation of an example of an application example of the memory system illustrated in FIG. 5.

FIG. 6 is a block diagram illustrating a representation of an example of an application example of the memory system illustrated in FIG. 5.

Referring to FIG. 6, the memory system 2000 may include a semiconductor memory device 2100 and a controller 2200. The semiconductor memory device 2100 may include a plurality of semiconductor memory chips. The plurality of semiconductor memory chips may be divided into a plurality of groups.

In FIG. 6, the plurality of groups are illustrated to communicate with the controller 2200 through first to k$^{th}$ channels CH1 to CHk, respectively. Each semiconductor memory chip may be configured and operate similar to the semiconductor memory device 100 described with reference to FIGS. 1-4.

Each group may be configured to communicate with the controller 2200 through one common channel. The controller 2200 may be configured similar to the controller 1200 described with reference to FIG. 5 and configured to control the plurality of semiconductor memory chips of the semiconductor memory device 2100 through the plurality of channels CH1 to CHk.

Figure 7:
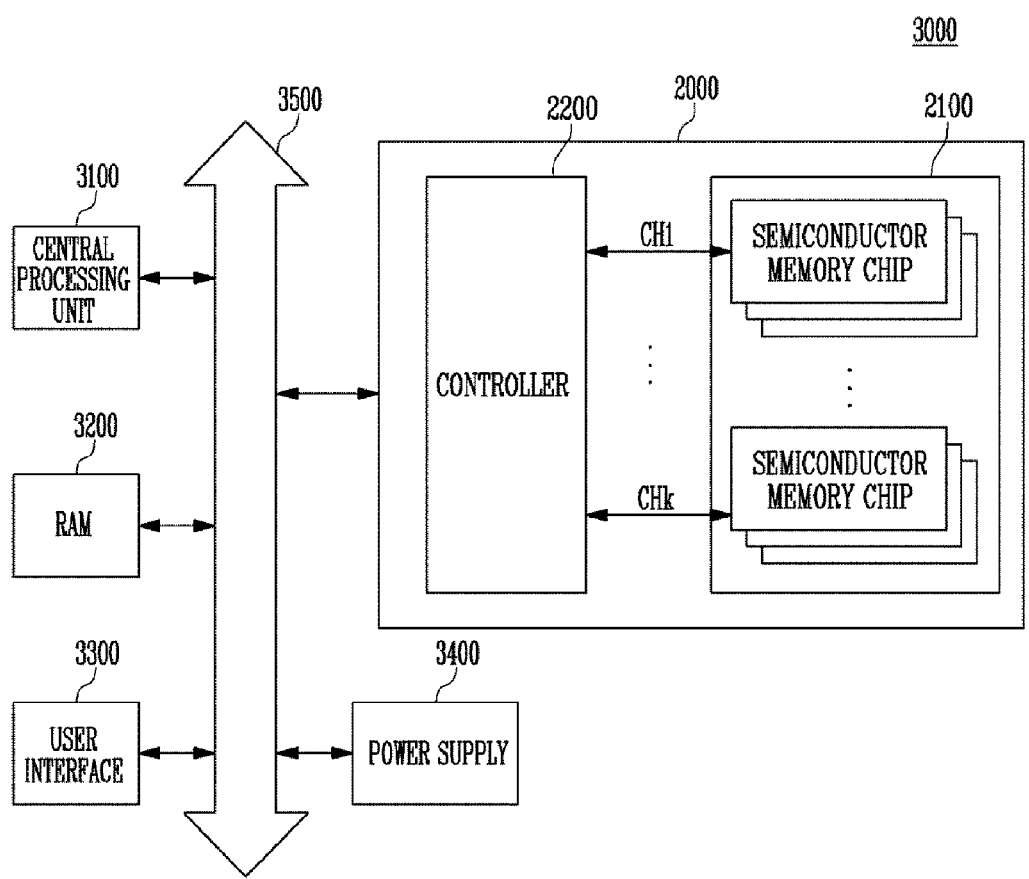
FIG. 7 is a block diagram illustrating a representation of an example of a computing system including the memory system described with reference to FIG. 6.

FIG. 7 is a block diagram illustrating a representation of an example of a computing system including the memory system described with reference to FIG. 6.

Referring to FIG. 7, the computing system 3000 may include a central processing unit 3100, a RAM 3200, and a user interface 3300. The computing system 3000 may include a power supply 3400, a system bus 3500, and the memory system 2000.

The memory system 2000 may be electrically connected to the central processing unit 3100, the RAM 3200, the user interface 3300, and the power supply 3400 through the system bus 3500. Data, provided through the user interface 3300 or processed by the central processing unit 3100, may be stored in the memory system 2000.

In FIG. 7, the semiconductor memory device 2100 may be connected to the system bus 3500 through the controller 2200. However, the semiconductor memory device 2100 may be configured to be directly connected to the system bus 3500. In this example, a function of the controller 2200 may be performed by the central processing unit 3100 and the RAM 3200.

In FIG. 7, the memory system 2000 described with reference to FIG. 6 is provided. However, the memory system 2000 may be replaced by the memory system 1000 described with reference to FIG. 5. In an embodiment, the computing system 3000 may be configured to include either of the memory systems 1000 and 2000 described with reference to FIGS. 5 and 6.

According to the various embodiments, in a program operation of the semiconductor memory device including the plurality of memory blocks, the program operation may be performed on a selected memory block and, at the same time, some of the source and drain select transistors included in an unselected memory block may be floated and thus the channel potential of a cell string may be prevented from increasing. Therefore, data may be accurately read when a subsequent read operation is performed.

In the drawings and specification, there have been disclosed various embodiments, and although specific terms are employed, they are used in a generic and descriptive sense only and not for purposes of limitation. It will be understood by those of ordinary skill in the art that various changes in form and details may be made herein without departing from the spirit and scope of the application.

What is claimed is:

1. A semiconductor memory device, comprising:
   a memory cell array including a plurality of memory blocks; and
   a peripheral circuit configured to select one of the plurality of memory blocks and perform a program operation on selected memory cells of the selected memory block when the program operation is performed,
   wherein the peripheral circuit is configured to float a plurality of source select lines and a plurality of drain select lines of only an unselected memory block of the plurality of memory blocks when the program operation is performed.

2. The device of claim 1, wherein the peripheral circuit floats some source select lines of the plurality of source select lines and some drain select lines of the plurality of drain select lines.

3. The device of claim 2, wherein the peripheral circuit applies a ground voltage to all of the source select lines except the some source select lines and all of the drain select lines except the some drain select lines.

4. The device of claim 1, wherein the peripheral circuit floats a source select line, selected from the plurality of source select lines and connected to a source select transistor adjacent to a common source line, and floats a drain select line, selected from the plurality of drain select lines and connected to a drain select transistor adjacent to a bit line.

5. The device of claim 1, wherein the peripheral circuit increases a threshold voltage of a pipe transistor included in the selected memory block when the program operation is performed.

6. The device of claim 1, wherein the peripheral circuit selects a next memory block and performs a program operation after the program operation on the selected memory block is completed.

7. The device of claim 1, wherein the peripheral circuit is configured to apply a power voltage to bit lines and common source lines connected to the unselected memory block.

8. A semiconductor memory device, comprising:
   a memory cell array including a plurality of memory blocks;
   a peripheral circuit configured to sequentially perform a program operation on the plurality of memory blocks; and
   a control circuit configured to control the peripheral circuit to perform the program operation, wherein the control circuit controls the peripheral circuit to float a plurality of source select transistors and a plurality of drain select transistors only included in an unselected memory block of the plurality of memory blocks.

9. The device of claim 8, wherein the control logic controls the peripheral circuit so that some source select transistors of the plurality of source select transistors and some drain select transistors of the plurality of drain select transistors are floated.

10. The device of claim 9, wherein the control logic controls the peripheral circuit to apply a ground voltage to all of the source select transistors except the some source select transistors and to all of the drain select transistors except the some drain select transistors.

11. The device of claim 8, wherein the control logic controls the peripheral circuit to float the source select transistor, selected from the plurality of source select lines and adjacent to a common source line, and to float the drain select transistor, selected from the plurality of drain select lines and adjacent to a bit line.

12. The device of claim 8, wherein the control logic controls the peripheral circuit to increase a threshold voltage of a pipe transistor included in the selected memory block when the program operation is performed.

13. The device of claim 8, wherein the peripheral circuit is configured to apply a power voltage to bit lines and common source lines connected to the unselected memory block.

14. A method of operating a semiconductor memory device, comprising:
   selecting a memory block of a plurality of memory blocks in order to perform a program operation;
   performing the program operation on the selected memory block; and
   floating gates of a plurality of source select transistors and gates of a plurality of drain select transistors, included in all of the memory blocks except the selected memory block.

15. The method of claim 14, wherein the program operation increases a threshold voltage of a pipe transistor included in the selected memory block.

16. The method of claim 14, wherein the floating of the gates of the plurality of source select transistors and the gates of the plurality of drain select transistors comprises floating gates of some source select transistors of the plurality of source select transistors and gates of some drain select transistors of the plurality of drain select transistors.

17. The method of claim 16, wherein the floating of the gates of the plurality of source select transistors and the gates of the plurality of drain select transistors comprises applying a ground voltage to all of the source select transistors except the some source select transistors and all of the drain select transistors except the some drain select transistors.

18. The method of claim 14, wherein the floating of the gates of the plurality of source select transistors and the gates of the plurality of drain select transistors comprises floating a gate of the source select transistor, selected from the plurality of source select transistors and adjacent to a common source line, and floating a gate of the drain select transistor, selected from the plurality of drain select transistors and adjacent to a bit line.

19. The method of claim 14, further comprising:
   applying a power voltage to bit lines and common source lines connected to some of the memory blocks except the selected memory block.

* * * * *